United States Patent
Wakiyama

(10) Patent No.: US 8,962,440 B2
(45) Date of Patent: Feb. 24, 2015

(54) SEMICONDUCTOR DEVICE AND METHOD OF MANUFACTURING SEMICONDUCTOR DEVICE

(71) Applicant: Sony Corporation, Tokyo (JP)

(72) Inventor: Satoru Wakiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/462,776

(22) Filed: Aug. 19, 2014

(65) Prior Publication Data

US 2014/0357025 A1 Dec. 4, 2014

Related U.S. Application Data

(62) Division of application No. 13/312,565, filed on Dec. 6, 2011, now Pat. No. 8,841,783.

(30) Foreign Application Priority Data

Dec. 17, 2010 (JP) .................................. 2010-282082

(51) Int. Cl.
  *H01L 21/20* (2006.01)
  *H01L 21/56* (2006.01)
  *H01L 23/544* (2006.01)
  *H01L 23/00* (2006.01)

(52) U.S. Cl.
  CPC ............ *H01L 21/561* (2013.01); *H01L 21/563* (2013.01); *H01L 23/544* (2013.01); *H01L 24/11* (2013.01); *H01L 2224/11015* (2013.01)
  USPC .......................................................... 438/401

(58) Field of Classification Search
  CPC ........... H01L 2924/01078; H01L 2924/01013; H01L 2924/01079; H01L 2924/01029; H01L 23/544; H01L 2223/54453
  USPC ............... 438/22, 24–25, 612–614, 401, 462, 438/975, 408; 257/797, 100, 781, 737
  See application file for complete search history.

(56) References Cited

U.S. PATENT DOCUMENTS

| | | | |
|---|---|---|---|
| 2005/0253161 A1* | 11/2005 | Horio et al. | .................... 257/100 |
| 2009/0134515 A1 | 5/2009 | Hu | |
| 2012/0126395 A1 | 5/2012 | Lee et al. | |

FOREIGN PATENT DOCUMENTS

JP    2000-196051    7/2000

* cited by examiner

*Primary Examiner* — Hoa B Trinh
(74) *Attorney, Agent, or Firm* — Dentons US LLP

(57) ABSTRACT

A semiconductor device including a semiconductor element; a pad electrode that is formed on the semiconductor element; an alignment mark that is formed on the semiconductor element; a connection electrode that is formed on the pad electrode; and an underfill resin that is formed to cover the connection electrode. The height of the alignment mark from the semiconductor element is greater than that of the connection electrode.

2 Claims, 8 Drawing Sheets

SEMICONDUCTOR DEVICE AND METHOD OF MANUFACTURING SEMICONDUCTOR DEVICE

RELATED APPLICATION DATA

This application is a division of U.S. patent application Ser. No. 13/312,565 filed Dec. 6, 2011, the entirety of which is incorporated herein by reference to the extent permitted by law. The present application claims the benefit of priority to Japanese Patent Application No. JP 2010-282082 filed on Dec. 17, 2010 in the Japan Patent Office, the entirety of which is incorporated by reference herein to the extent permitted by law.

BACKGROUND

The present disclosure relates to a semiconductor device, in which alignment marks for flip chip connection are formed, and a method of manufacturing the semiconductor device.

In the related art, in flip chip mounting in which the semiconductor chip is mounted by solder bumps, the alignment marks are formed by using metal wire on the semiconductor chip. Further, in flip chip mounting, the semiconductor chip is mounted, and the lower portion of the mounted semiconductor chip is filled with an underfill resin for improving reliability. Further, in order to prevent resin contamination caused by flow of the underfill resin from occurring on the electrodes such as the wire bonding pads which are formed on the mounting board or the semiconductor device, a technique of forming a dam in a region filled with the underfill resin has been studied (for example, refer to Japanese Unexamined Patent Application Publication No. 2005-276879).

SUMMARY

In flip chip mounting, there is proposed a method of forming the underfill resin, which covers the solder bumps, on the surface where the semiconductor chips are mounted in advance. In this method, the underfill resin is also formed on the alignment marks of the semiconductor chips. Hence, at the time of the mounting, it is necessary to check the positions of the alignment marks through the underfill resin. However, since the optical transparency of the underfill resin filled with a filler and the like is low, it is difficult to identify the alignment marks formed on the lower side of the underfill resin.

For this reason, it is difficult to accurately align their positions at the time of mounting the semiconductor chips, and thus a problem arises in that connection error such as short between the bumps occurs.

According to embodiments of the disclosure, it is desirable to provide a semiconductor device and a method of manufacturing the semiconductor device capable of easily recognizing the alignment marks and accurately aligning the positions using the alignment marks.

According to an embodiment of the disclosure, provided is a semiconductor device including a semiconductor element; a pad electrode that is formed on the semiconductor element; an alignment mark that is formed on the semiconductor element; a connection electrode that is formed on the pad electrode; and an underfill resin that is formed to cover the connection electrode. In addition, the height of the alignment mark from the semiconductor element is greater than that of the connection electrode.

Further, according to another embodiment of the disclosure, provided is a semiconductor device including a first electronic component that has the configuration of the above-mentioned semiconductor device; a second electronic component on which the first electronic component is mounted.

Furthermore, according to a further embodiment of the disclosure, a method of manufacturing the semiconductor device includes a process of providing a wafer on which a semiconductor element is formed, and a process of forming a barrier layer on the wafer. In addition, the method also includes a process of forming a first resist pattern, which has an opening portion located at a position of a formed alignment mark, on the barrier layer, and a process of forming the alignment mark in the opening portion of the first resist pattern by using an electrolytic plating method. Furthermore, the method also includes a process of forming a second resist pattern, which has an opening portion located at a position of a connection electrode of the semiconductor element so as to cover the barrier layer and the alignment mark, after removing the first resist pattern. The method also includes a process of forming the connection electrode in the opening portion of the second resist pattern by using the electrolytic plating method, and a process of providing an underfill resin on the semiconductor element so as to cover the connection electrode.

Further, according to a still further embodiment of the disclosure, a method of manufacturing a semiconductor device includes a process of forming a first electronic component, and a process of providing a second electronic component that has an alignment mark and a pad electrode. In addition, the method also includes a process of aligning a position of the first electronic component with a position of the second electronic component by using the alignment mark, electrically connecting the connection electrode and the pad electrode to each other, and mounting the first electronic component on the second electronic component.

In the method of manufacturing the semiconductor device according to the embodiment of the disclosure, the alignment mark of which the height is set to be greater than that of the connection electrode. Thereby, even in a state where the underfill resin is formed to cover the connection electrode, it becomes easy to recognize the alignment mark through the underfill resin. By performing flip chip connection of the semiconductor device having the alignment mark, it is possible to accurately align the mounting position, and thus it is possible to suppress the connection error.

Further, in the method of manufacturing the semiconductor device according to the embodiment of the disclosure, by forming the alignment mark of which the height is greater than the connection electrode, even after the underfill resin is formed to cover the connection electrode, it becomes easy to recognize the alignment mark. Hence, it is possible to manufacture the semiconductor device capable of suppressing the connection error.

According to the embodiments of the disclosure, even when the underfill resin is formed to cover the connection electrode, it is possible to provide a semiconductor device capable of easily recognizing the alignment mark and easily performing accurate positional alignment.

DETAILED DESCRIPTION OF EMBODIMENTS

Hereinafter, the example of the best mode for carrying out the disclosure will be described, but the embodiments of the disclosure are not limited to the following example.

In addition, the description will be given in the following order.

Figure 1:
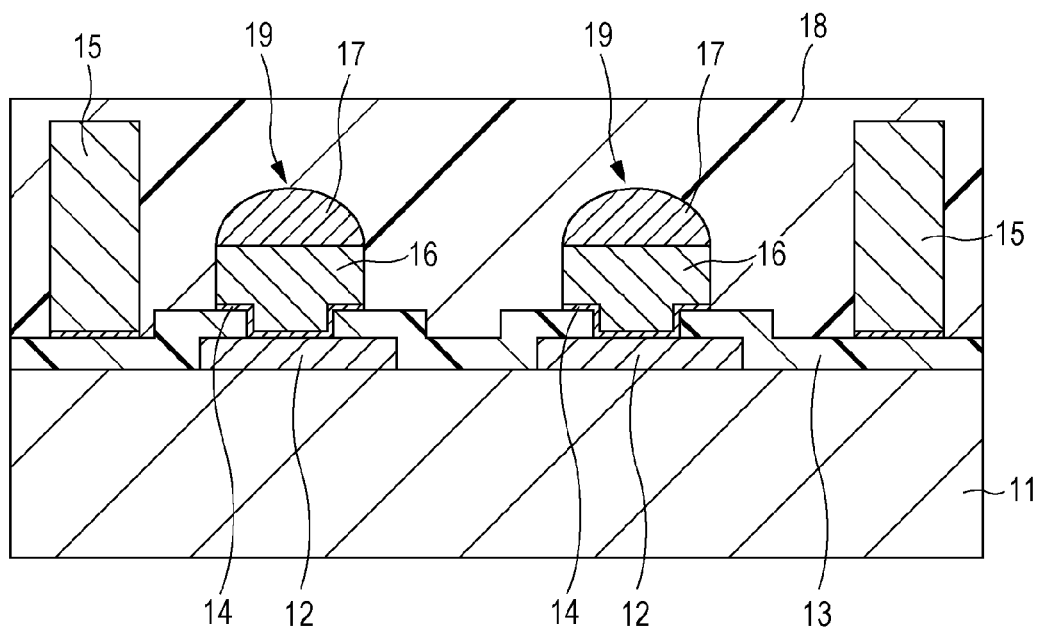
FIG. 1 is a diagram illustrating a configuration of a semiconductor device according to a first embodiment of the disclosure.

1. First Embodiment of Semiconductor device
2. Method of Manufacturing Semiconductor device According to First Embodiment
3. Second Embodiment of Semiconductor device
4. Method of Manufacturing Semiconductor device According to Second Embodiment
5. Modified Example of Alignment Mark 1. First Embodiment of Semiconductor Device A semiconductor device according to a first embodiment of the disclosure will be described. FIG. 1 shows the semiconductor device according to the first embodiment of the disclosure. The semiconductor device 10 shown in FIG. 1 will be described with reference to a sectional view illustrating a part in which bump electrodes 19 are formed on pad electrodes 12 on the semiconductor element 11.

The semiconductor device 10 has the pad electrodes 12 on the semiconductor element 11. Further, a passivation layer 13 is formed on the entire surface except openings of the pad electrodes 12 on the semiconductor element 11.

The bump electrodes 19 are formed as electrodes which are connected to external devices on the pad electrodes 12. In each bump electrode 19, the barrier layer 14 is formed on the pad electrode 12. In addition, an under bump metal (UBM) 16 is provided on the barrier layer 14. Furthermore, a bump 17 corresponding to the pad electrode 12 is formed on the UBM 16.

Further, in the semiconductor device 10, alignment marks 15 are formed on the passivation layer 13. In addition, an underfill resin 18 is formed on the entire surface of the semiconductor element 11 so as to cover the bump electrode 19, the alignment marks 15, and the passivation layer 13.

Each pad electrode 12 is made of, for example aluminum, and is connected to an electronic circuit of a wafer, which is not shown, in the semiconductor element 11. Further, the passivation layer 13 is formed around the surface of the pad electrode 12, and the barrier layer 14 and the UBM 16 are formed in the center thereof.

The barrier layer 14 is formed to cover the center portion of each pad electrode 12. Further, the barrier layer 14 is formed as the lower layer of the part, in which the UBM 16 is formed, on the passivation layer which is formed around the surface of the pad electrode 12.

Furthermore, likewise, the barrier layer 14 is formed between the lower portions of the alignment marks 15 and the passivation layer 13 like the upper portions of the pad electrodes 12.

The barrier layer 14 is made of, for example, Ti, Cu, or the like.

Each UBM 16 is formed in the center portion of the pad electrode 12 through the above-mentioned barrier layer 14. Further, the bump 17 is formed on the UBM 16. Likewise, the bump electrode 19 is formed on the pad electrode 12 so as to include the barrier layer 14, the UBM 16, and the bump 17.

The UBM 16 is formed to have a thickness equal to or more than a certain level is eroded by the solder forming the bump 17. The UBM 16 is formed of, for example, Ni, Ti, TiW, W, Cu, and the like. Normally, the UBM 16 is formed to be thicker than that of the barrier layer 14 or that of the pad electrode 12 in order to prevent a solder alloy such as SnAg formed on the UBM 16 from diffusing into the pad electrode 12 made of AlCu, Cu, or the like.

Each bump 17 is formed on the UBM 16 in a spherical shape protruding from the pad electrode 12. The bump 17 is formed of, for example, a solder alloy such as SnAg. Further, the solder ally may not be formed as the bump 17 on the UBM 16, and antioxidant treatment using Ni/Au or the like may be performed on the UBM 16.

The alignment marks 15 are formalized at predetermined positions on the semiconductor element 11. A plurality of the alignment marks 15 are formed in order to align the positions thereof when the semiconductor device 10 is set on a different semiconductor device or a mounting board, and are formed on the semiconductor element 11 in order to correct distortion and the like of the semiconductor device 10.

Generally, the alignment marks formed on the semiconductor element and the like are formed in the same process for the pad electrodes 12. Hence, each alignment mark is formed on the same plane of the pad electrode 12 so as to have a thickness the same as that of the pad electrode 12.

On the other hand, the alignment mark 15 of the semiconductor device 10 according to the embodiment is formed on the passivation layer 13 in a columnar shape. The alignment mark 15 is formed such that the height thereof from the surface of the semiconductor element 11 is greater than the bump electrode 19 which is formed on the pad electrode 12.

Further, the height of the alignment mark 15 may be equal to the height of the underfill resin 18. Further, it is preferable that the height of the alignment mark 15 should be formed to be equal to or less than that of the underfill resin 18. In addition, even after the underfill resin 18 is formed, it is possible to easily recognize the alignment mark 15. Thus, the height of the alignment mark 15 has only to be the height which does not cause a defect at the time of mounting the semiconductor device 10.

At the time of mounting the semiconductor device 10, the underfill resin 18 is formed to have a thickness at which the underfill resin 18 covers the connection portions of the bumps 17, that is, the mounting surface of the semiconductor device 10. For example, it is preferable that the thickness of the underfill resin from the surface of the semiconductor element 11 should be set to be equal to or greater than the distance between the mounting surface of the mounted semiconductor device 10 and the mounting surface of the semiconductor device or the mounting board on which the semiconductor device 10 is mounted.

By adopting a configuration in which the gap between the semiconductor device 10 and the mounting board is filled with the underfill resin 18, it is possible to secure mount reliability. By forming the alignment mark 15 of which the height is greater than the height of the bump electrode 19, it becomes easy to identify the alignment mark 15 even in the semiconductor device 10 of which the surface is coated with the underfill resin 18 having low transparency.

It is preferable that the alignment mark 15 should be formed of the same material as the under bump metal (UBM) 16 such as Ni, Ti, TiW, W, and Cu. Further, the alignment mark may be formed of a material different from that of the UBM 16.

In addition, the alignment mark 15 in the semiconductor device 10 is formed on the passivation layer 13, but may be formed on the same plane of the pad electrode 12. In this case, the alignment mark 15 may be formed of a material the same as that of the pad electrode 12.

2. Method of Manufacturing Semiconductor Device According to First Embodiment Next, the method of manufacturing the semiconductor device according to the first embodiment will be described. In addition, in the case where the above-mentioned common elements shown in FIG. 1 exist, those elements will be referenced by the same reference numerals and signs, and detailed description thereof will be omitted.

In addition, the following description will be given with reference to the sectional view of one semiconductor element among the plurality of semiconductor elements formed on the semiconductor wafer.

Figure 2A:
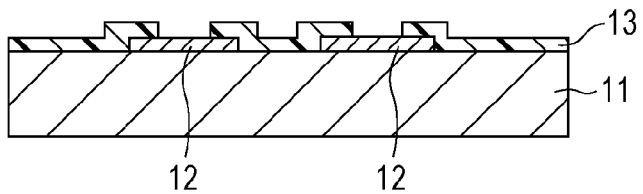
FIGS. 2A to 2E are diagrams illustrating a method of manufacturing the semiconductor device according to the first embodiment of the disclosure.

First, as shown in FIG. 2A, there is provided a wafer on which the semiconductor element 11 having the pad electrodes 12 and the passivation layer 13 is formed. Then, by performing reverse sputtering on the surface of the semiconductor element 11 on the wafer, an oxide film and the like on the surfaces of the pad electrodes 12 are removed.

Figure 2B:
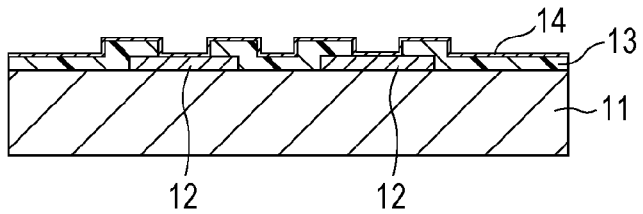

Next, as shown in FIG. 2B, by using the sputtering method, the pad electrodes 12 and the passivation layer 13 are covered, and the barrier layer 14 is formed on the entire surface of the semiconductor element 11. In the formation of the barrier layer 14, for example, a Ti layer is formed on the pad electrodes 12 and the passivation layer 13 by using the sputtering method. Then, likewise by using the sputtering method, a Cu layer is formed to cover the Ti layer.

Figure 2C:
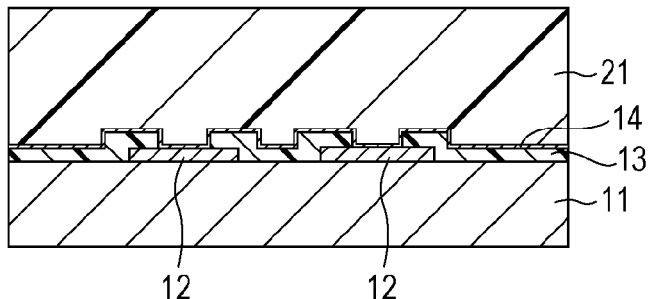

Next, as shown in FIG. 2C, a photo resist layer 21 is formed on the barrier layer 14. The photo resist layer 21 is formed by forming a coated film in for example a spin coating method so as to cover the surface of the wafer and subsequently drying the coated film. Further, the photo resist layer 21 is formed to have a thickness equal to or greater than the height of each alignment mark 15 formed on the semiconductor element 11.

Figure 2D:
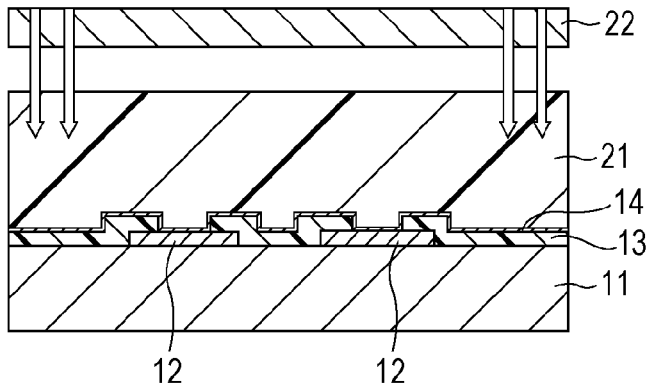
Figure 2E:
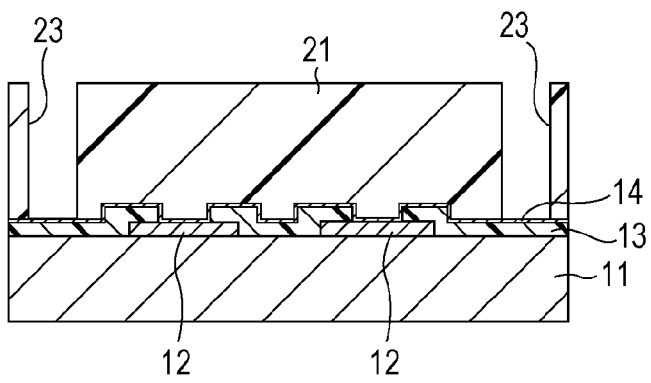

Next, as shown in FIG. 2D, the exposure treatment is performed on the photo resist layer 21 through the photomask 22. The photomask 22 employs a pattern for illuminating the exposure light on the region in which the alignment marks are formed. Then, as shown in FIG. 2F, by performing the development treatment on the photo resist layer 21, the exposed portions of the photo resist layer 21 are removed, whereby opening portions 23 are formed on the photo resist layer 21. The opening portions 23 are formed on the semiconductor element 11 so as to correspond to the formation positions of the alignment marks.

Figure 3A:
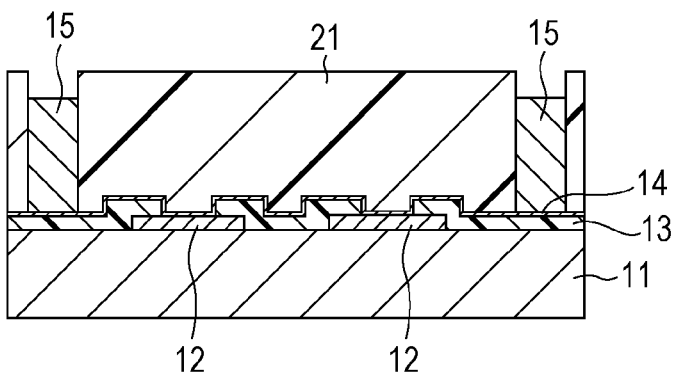
FIGS. 3A to 3D are diagrams illustrating the method of manufacturing the semiconductor device according to the first embodiment of the disclosure.

Next, as shown in FIG. 3A, by using the electrolytic plating method, a plating layer is formed on the opening portions 23 of the photo resist layer 21, whereby the alignment marks 15 are formed. Thereby, the alignment marks 15 are formed on the semiconductor element 11 and the barrier layer 14.

The alignment mark 15 is formed of a plating layer such as Ni, Ti, TiW, W, and Cu. The alignment mark 15 is formed to have a height which is equal to or greater than that of the bump electrode 19 formed on the pad electrode of the semiconductor element 11.

Figure 3B:
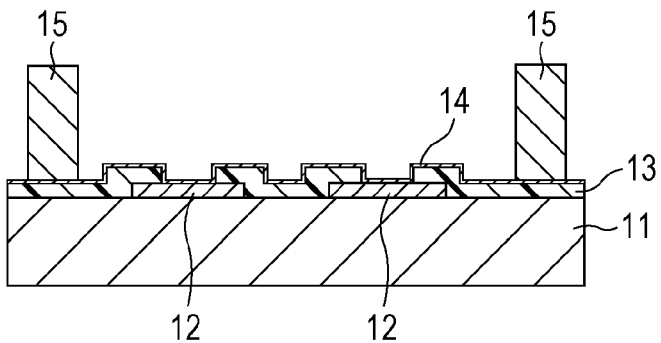
Figure 3C:
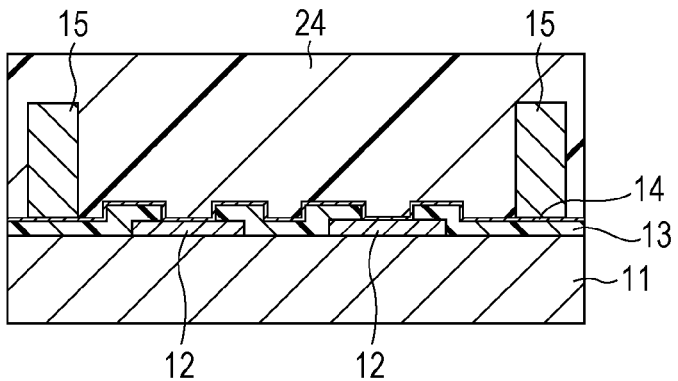

Next, as shown in FIG. 3B, the photo resist layer 21 is removed from the semiconductor element 11. Then, as shown in FIG. 3C, the photo resist layer 24 is formed on the barrier layer 14. The photo resist layer 24 is formed by forming a coated film in for example the spin coating method so as to cover the surface of the wafer and the alignment marks 15 and subsequently drying the coated film.

Figure 3D:
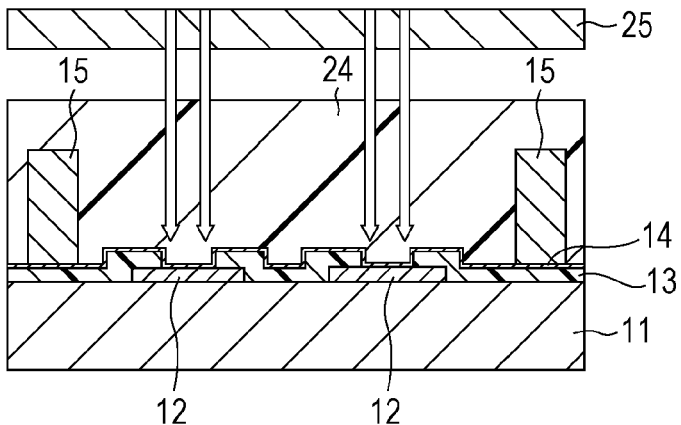

Next, as shown in FIG. 3D, the exposure treatment is performed on the photo resist layer 24 through the photomask 25. The photomask 25 employs a pattern for illuminating the exposure light on the center portions of the pad electrodes 12. Then, by performing the development treatment on the photo resist layer 24 after the exposure, the exposed portions are removed, whereby the opening portions 26 are formed on the photo resist layer 24.

Figure 4A:
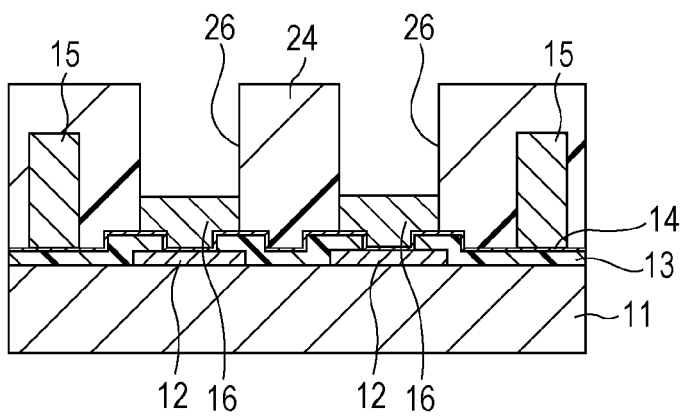
FIGS. 4A to 4D are diagrams illustrating the method of manufacturing the semiconductor device according to the first embodiment of the disclosure.
Figure 4B:
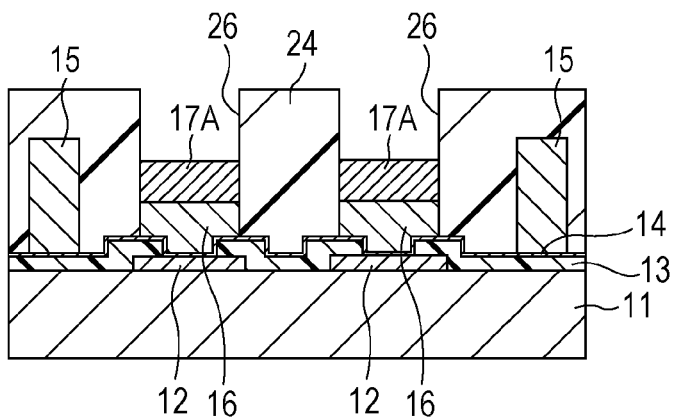

Subsequently, as shown in FIG. 4A, by using the electrolytic plating method, the under bump metal (UBM) 16 is formed in each opening portion 26. Furthermore, as shown in FIG. 4B, a solder layer 17A is formed on the UBM 16 in the opening portions 26 by using the electrolytic plating method. The UBM 16 is, similarly to the alignment mark 15, formed of Ni, Ti, TiW, W, Cu, and the like in the electrolytic plating. Further, the solder layer 17A is formed by the electrolytic plating using the solder alloy such as SnAg.

Figure 4C:
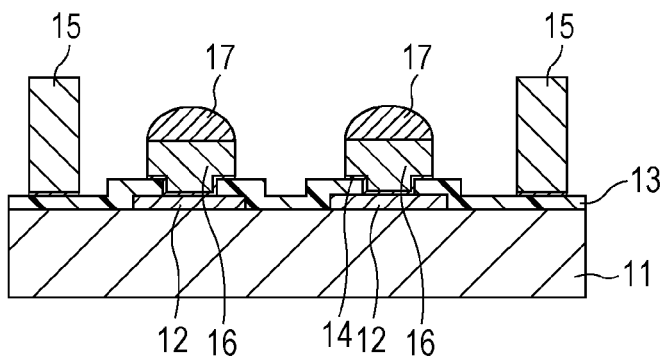

Next, after the photo resist layer 24 is removed, the barrier layer 14 exposed on the surface of the semiconductor element 11 is removed by sputter etching. Then, as shown in FIG. 4C, the bumps 17 are formed by melting the semiconductor layer through the reflow. In the removal of the barrier layer 14, by using the UBM 16 and the solder layer 17A as a mask, the barrier layer 14 is made to remain under the UBM 16 throughout the entire surface. Further, since each alignment mark 15 serves as an etching mask, the barrier layer 14 also remains under the alignment mark 15. Furthermore, by forming the solder layer 17A into spherical bumps 17 through the reflow, each bump electrode 19 is formed of the UBM 16 and the bump 17 on the pad electrode 12.

Figure 4D:
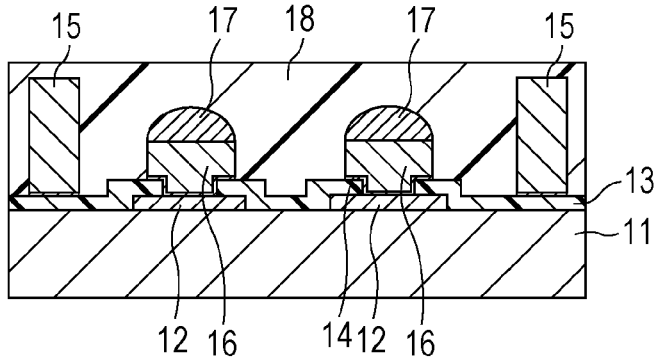

Next, as shown in FIG. 4D, the underfill resin 18 is formed on the surface of the wafer on the semiconductor element 11 side. The underfill resin 18 is formed by the spin coating method using an application liquid containing, for example, the underfill resin or by laminating a dry film of the underfill resin. Then, by cutting the semiconductor element 11 from the wafer and into separate pieces, the semiconductor device 10 is manufactured.

As described above, by using the photolithography and the electrolytic plating, the alignment marks 15, the UBM 16, and the solder bumps 17 are formed on the surface of the wafer on which the semiconductor element 11 is formed. Each alignment mark 15 is formed such that the height of the upper surface thereof is greater than the height of the bump electrode 19 from the formation surface of the semiconductor element 11. Further, when the formation surface of the bump electrode 19 of the semiconductor element 11 is coated with the underfill resin 18, the alignment mark 15 is also coated therewith at the same time. At this time, the underfill resin 18 is formed to have a thickness equal to or greater than the height of the alignment mark 15.

In addition, in the manufacturing method according to the above-mentioned embodiment, the alignment marks 15 are formed before the process of forming the UBM 16 and the solder layer 17A. However, the order of the process of forming the UBM 16 and the solder layer 17A and the process of forming the alignment marks 15 are not particularly limited. The processes of forming the alignment mark 15, the UBM 16, and the solder layer 17A can be formed regardless of the order thereof if the processes are subsequent to the process of forming the barrier layer 14 and are previous to the process of etching the barrier layer 14.

3. Second Embodiment of Semiconductor Device

Figure 5A:
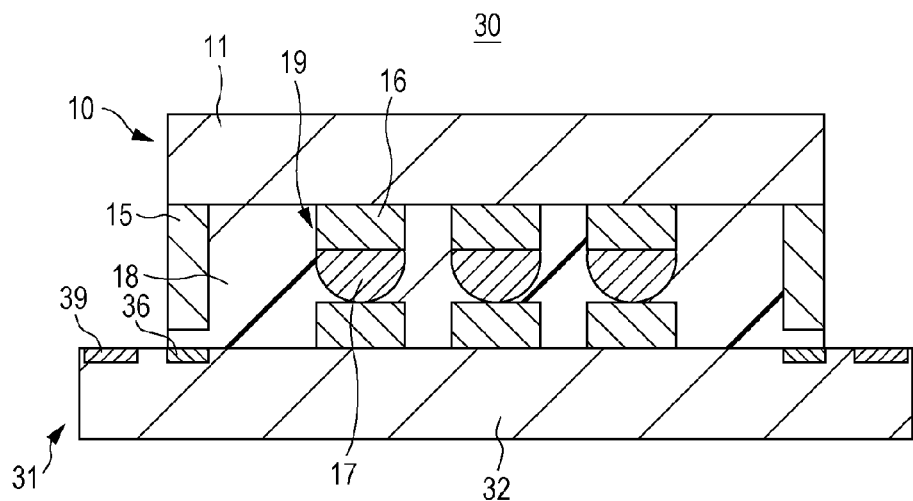
FIGS. 5A and 5B are diagrams illustrating a configuration of a semiconductor device according to a second embodiment of the disclosure.
Figure 5B:
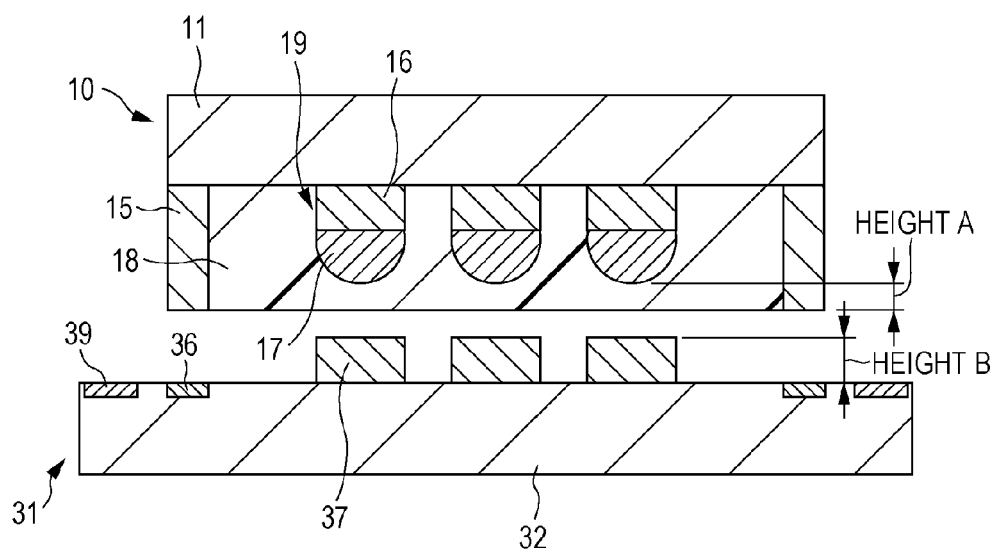

Next, a semiconductor device according to a second embodiment of the disclosure will be described. FIGS. 5A and 5B show the semiconductor device according to the second embodiment of the disclosure. The semiconductor device shown in FIGS. 5A and 5B includes a first electronic component and a second electronic component. The first electronic component has a configuration the same as the semiconductor device according to the first embodiment shown in FIG. 1. Further, the second electronic component includes a semiconductor device on which the semiconductor device according to the first embodiment is mounted. Hereinafter, a description will be given under the assumption that the semiconductor device according to the second embodiment is a semiconductor device 30, the semiconductor device formed as the first electronic component is a first semiconductor device 10, and the semiconductor device formed as the second electronic component is a second semiconductor device 31.

The second semiconductor device 31 shown in FIGS. 5A and 5B will be described with reference to a sectional view illustrating a part in which alignment marks 36 and under bump metals (UBM) 37 for electrode connection are formed on the semiconductor element 32.

The first semiconductor device 10 has the same configuration as that of the above-mentioned first embodiment. In addition, FIGS. 5A and 5B show only a configuration which is necessary to describe the semiconductor device according to the second embodiment, where configurations of the pad electrodes which are formed on the semiconductor element 11, the passivation layer, and the like are omitted.

As shown in FIG. 5A, in the first semiconductor device 10, the alignment marks 15 are formed at predetermined positions on the semiconductor element 11. Further, each bump electrode 19 is formed of the UBM 16 and the bump 17 at the position corresponding to the pad electrode of the semiconductor element 11. Furthermore, the height of the alignment mark 15 is larger than the height of the bump electrode 19 on the semiconductor element 11. Then, the underfill resin 18 is formed to cover the bump electrodes 19 and the alignment marks 15.

Further, as shown in FIG. 5A, in the second semiconductor device 31, the alignment marks 36 are formed at predetermined positions of the semiconductor element 32. Each alignment mark is formed on the same layer as the pad electrode and at a height substantially equal to that of the surface of the semiconductor element 32 by using the wiring and the like of the semiconductor element 32. Furthermore, the UBM 37 is formed as a connection pad at the position corresponding to the pad electrode of the semiconductor element 32. The UBM 37 can be configured like the UBM 16 of the first semiconductor device 10, and is formed of, for example, Ni, Ti, TiW, W, Cu, and the like.

The wire bonding pads 39 are formed at the end portions of the second semiconductor device 31. In each wire bonding pad 39, the second semiconductor device 31 and the external electronics are electrically connected through the wire bonding.

In addition, in the second semiconductor device 31, similarly to the above-mentioned first semiconductor device 10, the pad electrodes and the passivation layer are formed on the semiconductor element 32. However, only the configuration necessary to describe the semiconductor device according to the second embodiment is shown, and the description of the other configurations will be omitted.

As shown in FIG. 5A, in the semiconductor device 30, the first semiconductor device 10 is mounted on the second semiconductor device 31. In the semiconductor device 30, the first semiconductor device 10 and the second semiconductor device 31 are disposed such that the electrode formation surfaces thereof are opposed to each other. Further, in the semiconductor device 30, the first semiconductor device 10 and the second semiconductor device 31 are disposed such that the positions of the alignment marks 15 of the first semiconductor device 10 are aligned with the positions of the alignment marks 36 of the second semiconductor device 31.

Furthermore, each bump 17 of the first semiconductor device 10 comes into contact with the UBM 37 of the second semiconductor device 31, whereby the first semiconductor device 10 and the second semiconductor device 31 are electrically connected. Then, through the underfill resin 18, the first semiconductor device 10 and the second semiconductor device 31 are mechanically connected, and the connection between the bump electrode 19 and the UBM 37 is formed in the underfill resin 18. As described above, in the semiconductor device 30, by filling the gap between the first semiconductor device 10 and the second semiconductor device 31, a filler is formed by the underfill resin 18.

Next, the height of the alignment mark in the semiconductor device according to the second embodiment will be described.

In the semiconductor device according to the second embodiment, the difference in height between the pad electrode and the alignment mark formed in the first semiconductor device is set to be less than the height of the connection pad formed in the second semiconductor device.

In the semiconductor device 30 shown in FIG. 5B, the height of the alignment mark 15 of the first semiconductor device 10 is greater than the height of the bump electrode 19 of the first semiconductor device 10. Here, the difference in height between the bump electrode 19 and the alignment mark 15 is represented by the height A.

Further, the height of the UBM 37, which is formed as the connection pad in the second semiconductor device 31, from the element surface is represented by the height B.

In this case, the alignment mark 15 is formed such that the height A is equal to the height B or the height A is less than the height B.

Since the height A is equal to or less than the height B, even when the parallelism between the first semiconductor device 10 and the second semiconductor device 31 at the time of mounting, it is possible to prevent connection errors caused by pieces of the bumps from occurring. Hence, when the first semiconductor device 10 is mounted on the second semiconductor device 31, reliability in connection between the bump electrode 19 and the UBM 37 improves.

Further, in the case where the height A is greater than the height B, when the first semiconductor device 10 is mounted on the second semiconductor device 31, the alignment mark 15 and the alignment mark 36 comes into contact with each other before the connection between the bump electrode 19 and the UBM 37. Hence, connection error occurs.

In addition, in the case where each bump is formed as a connection pad of the second semiconductor device 31 on the UBM 37, the height from the semiconductor element surface of the second semiconductor device 31 to the bump is set to the height B mentioned above. Further, similarly to the case where the connection pad is formed only on the pad electrode, in the case where the connection pad of the second semiconductor device 31 is formed on the substantially same surface as the semiconductor element surface, the alignment mark 15 and the bump electrode 19 of the first semiconductor device 10 are formed at substantially the same height. Thereby, the alignment mark 15 is formed such that the height A is equal to the height B as described above.

Further, in the above-mentioned embodiment, the semiconductor device 31 is used as the second electronic component. However, as the second electronic component, for example, a mounting board, on which a wiring pattern for mounting the semiconductor device is formed, may be used. As the first electronic component, the above-mentioned semiconductor device having the alignment mark according to the first embodiment may be used, and as the second electronic component, there may be provided the alignment mark and the connection pad compatible with the semiconductor device according to the first embodiment. In the semiconductor device according to the second embodiment, the second electronic component may be applicable without being limited to the semiconductor device, the mounting board, and the like.

Further, in the above-mentioned semiconductor device according to the second embodiment, the alignment mark and the underfill resin higher than the connection electrode are formed on the side of the first semiconductor device as the first electronic component. However, the alignment mark and the underfill resin higher than the connection electrode may be formed on the second electronic component side. By providing the underfill resin on the first electronic component side, there is no contamination caused by resin at the time of forming the underfill resin on the electrodes formed around the portion in which wire bonding pads formed in the second semiconductor device are mounted. Hence, it is preferable that the alignment mark and the underfill resin higher than the connection electrode should be formed on the first electronic component side.

4. Method of Manufacturing Semiconductor Device According to Second Embodiment Next, the method of manufacturing the semiconductor device according to the second embodiment will be described. In addition, in the description of the following manufacturing method, in the case where the above-mentioned common elements shown in FIGS. 1 to 5 exist, those elements will be referenced by the same reference numerals and signs, and detailed description thereof will be omitted.

In addition, the following description will be given of the method of manufacturing the semiconductor device according to the second embodiment by using the above-mentioned semiconductor device manufactured by the first embodiment.

Figure 6A:
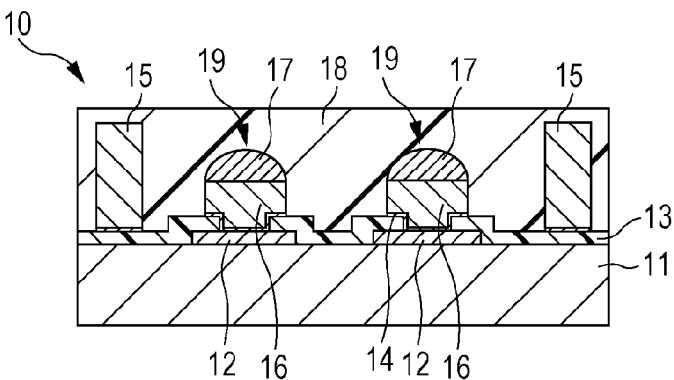
FIGS. 6A to 6C are diagrams illustrating a method of manufacturing the semiconductor device according to the second embodiment of the disclosure.

First, as shown in FIG. 6A, the above-mentioned first semiconductor device 10, which is manufactured by the first embodiment, is provided as the first electronic component.

Figure 6B:
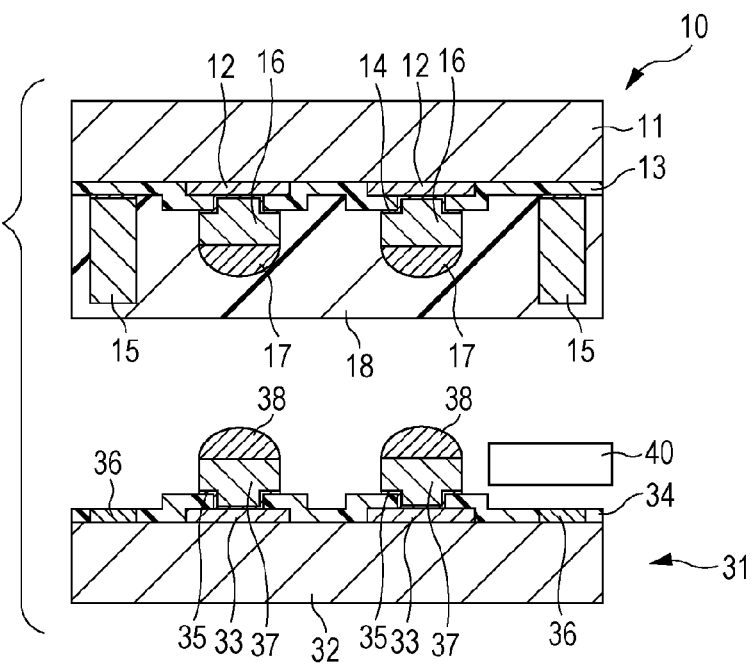

Further, as shown in FIG. 6B, the second semiconductor device, on which the connection pads and the alignment marks 36 are formed on the semiconductor element 32, is provided as the second electronic component. The second semiconductor device 31 has the pad electrodes 33 and the alignment marks 36 on the semiconductor element 32. Then, a passivation layer 34 is formed on the entire surface except the alignment marks 36 and the opening portions of the pad electrodes 33 on the semiconductor element 32. Further, each UBM 37 is formed on the pad electrode 33 through the barrier layer 35. The bump 38 is formed on the UBM 37. That is, in the second semiconductor device 31 shown in FIG. 6B, the connection pad for mounting the first semiconductor device 10 is formed of the pad electrode 33, the barrier layer 35, the UBM 37, and the bump 38. Furthermore, in the second semiconductor device 31, the alignment marks 36 are formed on the same layer of the pad electrodes 33.

Then, the positions of the first semiconductor device 10 and the second semiconductor device 31 are aligned. By using a camera 40, the positions of the alignment marks 15 and the alignment marks 36 are read. Subsequently, the position of the first semiconductor device 10 is adjusted such that the positions of the alignment marks 15 and 36 in the first semiconductor device 10 and the second semiconductor device 31 are aligned.

Figure 6C:
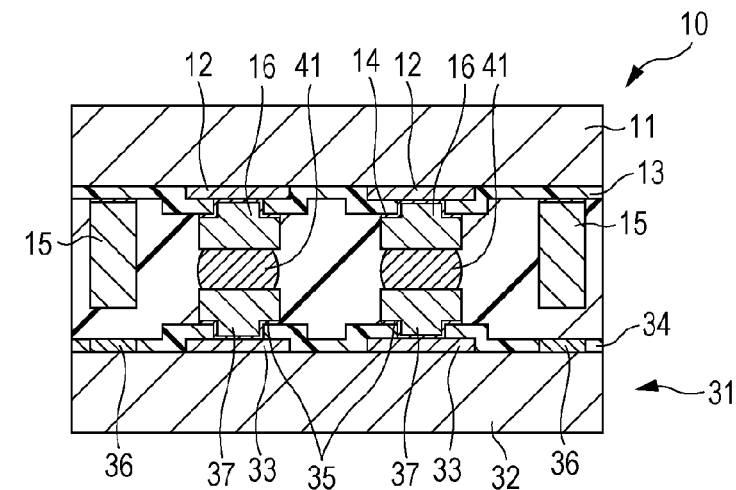

Next, as shown in FIG. 6C, the bumps 17 of the first semiconductor device 10 are brought into contact with the bumps 38 of the second semiconductor device 31, and then weighting is applied thereto. Further, at the time of applying the weighting, by heating the bumps up to the melting point or more of the solder, for example, in the case where the bumps 17 and 38 are made of Sn-3.5Ag, by heating the bumps up to the melting point of 221° C. or more through the bonding head or the stage, the bumps are melted and connected. Thereby, by breaching a surface oxide film of the solder forming the bumps 17 and 38, a connection portion 41 based on fluxless connection is formed. Through the connection portion 41, the first semiconductor device 10 and the second semiconductor device 31 are electrically connected.

Furthermore, the underfill resin, with which the first semiconductor device 10 and the second semiconductor device 31 are filled, is heated and cured. The underfill resin 18 bonds the semiconductor element 11 and the semiconductor element 32 to each other by pressing the semiconductor element 11 on the second semiconductor device 31. By bonding the semiconductor elements to each other through the underfill resin 18, mechanical connection reliability is improved.

Through the above processes, it is possible to manufacture the semiconductor device 30 according to the second embodiment.

In addition, when the first semiconductor device 10 and the second semiconductor device 31 are connected, the alignment marks 15 and the alignment marks 36 may be brought into direct contact with each other and may not be brought into contact with each other.

Further, in the description of the following manufacturing method, instead of the semiconductor device 31 used as the second electronic component, it may be possible to use the mounting board, in which the wiring pattern for mounting the semiconductor device, and the like. As the first electronic component, the above-mentioned semiconductor device having the alignment mark according to the first embodiment may be used, and as the second electronic component, there may be provided the alignment mark and the connection pad compatible with the semiconductor device according to the first embodiment.

5. Modified Example of Alignment Mark

Modified Example 1

Next, the shape of the alignment mark formed in the above-mentioned semiconductor device will be described.

Figure 7:
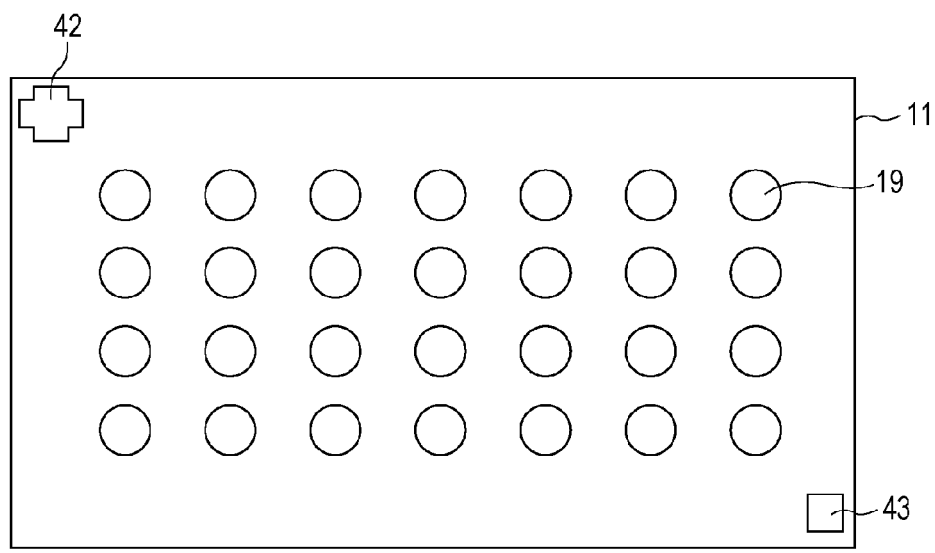
FIG. 7 is a diagram illustrating the configuration of the semiconductor device according to the first embodiment of the disclosure.

It is preferable that the alignment mark should be formed such that a planar shape thereof formed on the element surface is different from that of the bump electrode. For example, as shown in FIG. 7, normally the bump electrode 19 is formed in a circular shape on the semiconductor element 11. Hence, the alignment mark is formed in a shape different from the circular shape. Like the alignment mark 42, the alignment mark is formed in a cross shape which is formed by combining rectangular shapes. Further, like the alignment mark 43, a square alignment mark is formed. In addition, the alignment mark is formed in for example a star shape or a triangle shape.

As described above, by making the shape of the bump electrode different from the shape of the alignment mark formed in the semiconductor device, for example, even in a case where the bump electrode enters in the visual field of a camera for recognizing the alignment mark of the flip-chip bonder, it is possible to prevent false recognition.

Modified Example 2

Figure 8A:
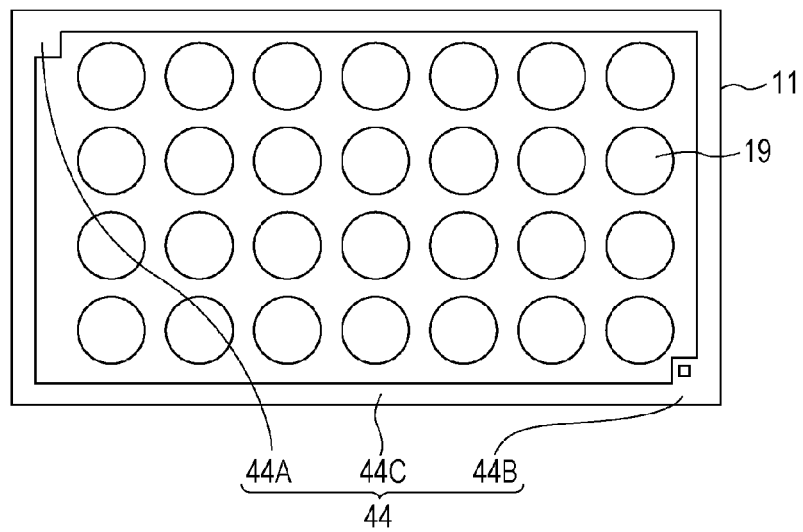
FIGS. 8A and 8B are diagrams illustrating the configuration of the semiconductor device according to the second embodiment of the disclosure.

Further, the alignment mark, which is formed in the semiconductor device, may be formed, for example as shown in FIG. 8A, so as to surround the outer peripheral portion of the semiconductor element.

In the semiconductor device shown in FIG. 8A, the bump electrodes 19 are formed in a circular shape on the semiconductor element 11. Then, the alignment mark 44 is formed to surround the outer peripheral portion of the semiconductor element 11. Furthermore, the underfill resin, which is formed on the side of the bump electrodes 19 of the semiconductor device, is formed inside the alignment mark 44 which surrounds the outer peripheral portion of the semiconductor element 11.

The alignment mark 44 has a rectangular alignment mark 44A which is formed on the corner portion of the semiconductor element 11 and an alignment mark 44B which is formed at the diagonal corner of the alignment mark 44A. Furthermore, the alignment mark 44 has an alignment mark 44C which is continuously formed on the outer peripheral portion of the semiconductor element 11.

Figure 8B:
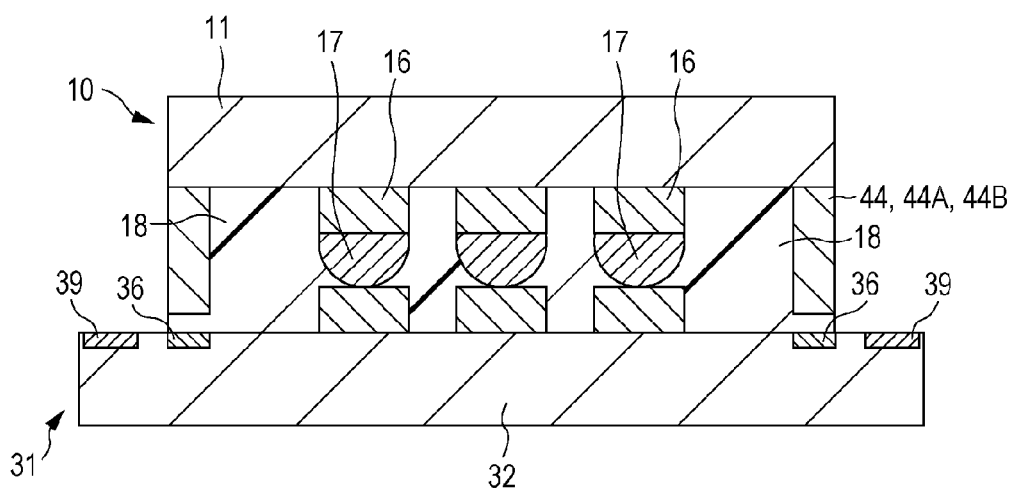

As shown in FIG. 8B, the alignment marks 44A and 44B are aligned with the alignment marks 36 of the second semiconductor device 31 at the time of mounting the second semiconductor device 31. Hence, it is preferable that the alignment marks should be formed in a shape different from that of the bump electrode 19.

Further, by surrounding the outer peripheral portion of the semiconductor element 11, it is possible to suppress outflow of the underfill resin.

When the mounting portion of the first semiconductor device is close to the electrode portions such as the wire bonding pads formed around the mounting portion, the underfill resin start flowing into the electrode portion near the mounting portion, whereby the electrode is contaminated by the resin. This tends to cause a problem when the distance between the mounting portion and the electrode portion is made to be short in the second semiconductor device by miniaturizing the semiconductor device.

Hence, by surrounding the outer peripheral portion of the semiconductor element 11, it is possible to prevent the underfill resin from contaminating the wire bonding pads 39 and the like formed in the second semiconductor device 31. Then, by decreasing the difference in element area between the first electronic component (the semiconductor device 10) and the second electronic component (the semiconductor device 31), it is possible to miniaturize the semiconductor device.

In addition, as shown in FIG. 8B, even when the alignment mark 44 and the element surface of the second semiconductor device 31 are spaced, it is possible to suppress outflow of the underfill resin 18. Hence, the alignment marks 15 may not come into direct contact with the element surface of the second semiconductor device 31.

In addition, the alignment marks in the above-mentioned semiconductor device according to the embodiment may be connected to, for example, the electrodes of the lower semiconductor element. For example, the alignment marks of the upper semiconductor element are formed on the electrodes of the upper semiconductor element, and the alignment marks of the lower semiconductor element is formed on the electrodes of the lower semiconductor element. Then, at the time of connecting the semiconductor elements to each other by forming the solder layer on the alignment marks of the lower semiconductor element, it is possible to form electrical connection between the alignment marks by connecting the alignment marks through the solder.

The present disclosure contains subject matter related to that disclosed in Japanese Priority Patent Application JP 2010-282082 filed in the Japan Patent Office on Dec. 17, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device comprising:
   providing a wafer on which a semiconductor element is formed;
   forming a barrier layer on the wafer;
   forming a first resist pattern, which has an opening portion located at a position of a formed alignment mark, on the barrier layer;
   forming the alignment mark in the opening portion of the first resist pattern by using an electrolytic plating method;
   forming a second resist pattern, which has an opening portion located at a position of a connection electrode of the semiconductor element so as to cover the barrier layer and the alignment mark, after removing the first resist pattern;
   forming the connection electrode in the opening portion of the second resist pattern by using the electrolytic plating method; and
   providing an underfill resin on the semiconductor element so as to cover the connection electrode.

2. A method of manufacturing a semiconductor device comprising:
   forming a first electronic component;
   providing a second electronic component that has an alignment mark and a pad electrode; and
   aligning a position of the first electronic component with a position of the second electronic component by using the alignment mark, electrically connecting the connection electrode and the pad electrode to each other, and mounting the first electronic component on the second electronic component,
   wherein the forming of the first electronic component includes
      providing a wafer on which a semiconductor element is formed,
      forming a barrier layer on the wafer, forming a first resist pattern, which has an opening portion located at a position of the formed alignment mark, on the barrier layer, forming the alignment mark in the opening portion of the first resist pattern by using an electrolytic plating method, forming a second resist pattern, which has an opening portion located at a position of a connection electrode of the semiconductor element so as to cover the barrier layer and the alignment mark, after removing the first resist pattern, forming the alignment mark in the opening portion of the second resist pattern by using the electrolytic plating method, and providing an underfill resin on the semiconductor element so as to cover the connection electrode.

* * * * *